(12) United States Patent
Hsu et al.

(10) Patent No.: US 8,344,412 B2
(45) Date of Patent: Jan. 1, 2013

(54) CHIP LEVEL PACKAGE OF LIGHT-EMITTING DIODE

(75) Inventors: Chia-Liang Hsu, Hsinchu (TW);
Shu-Ting Hsu, Hsinchu (TW);
Min-Hsun Hsieh, Hsinchu (TW);
Chih-Chiang Lu, Hsinchu (TW);
Alexander Wang, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 257 days.

(21) Appl. No.: 12/648,911

(22) Filed: Dec. 29, 2009

(65) Prior Publication Data
US 2010/0163907 A1 Jul. 1, 2010

(30) Foreign Application Priority Data
Dec. 30, 2008 (TW) .............................. 97151602 A

(51) Int. Cl.
*H01L 33/00* (2010.01)
(52) U.S. Cl. ................................. 257/99; 257/E33.062
(58) Field of Classification Search .................... 257/88, 257/99, E33.062
See application file for complete search history.

(56) References Cited

U.S. PATENT DOCUMENTS

| | | | |
|---|---|---|---|
| 6,412,971 B1 * | 7/2002 | Wojnarowski et al. | 362/241 |
| 7,276,742 B2 * | 10/2007 | Kohno et al. | 257/103 |
| 7,973,331 B2 * | 7/2011 | Hsu et al. | 257/99 |
| 8,058,669 B2 * | 11/2011 | Chen et al. | 257/99 |
| 2005/0023575 A1 * | 2/2005 | Wu et al. | 257/256 |
| 2005/0073840 A1 * | 4/2005 | Chou et al. | 362/238 |
| 2005/0263776 A1 * | 12/2005 | Hsieh et al. | 257/79 |
| 2006/0169993 A1 * | 8/2006 | Fan et al. | 257/88 |
| 2006/0202105 A1 * | 9/2006 | Krames et al. | 250/208.1 |
| 2007/0057364 A1 * | 3/2007 | Wang et al. | 257/701 |
| 2007/0176193 A1 * | 8/2007 | Nagai | 257/98 |
| 2007/0221907 A1 * | 9/2007 | Jang et al. | 257/13 |

FOREIGN PATENT DOCUMENTS

| | | |
|---|---|---|
| TW | I246780 | 1/2006 |
| TW | I290377 | 11/2007 |

* cited by examiner

*Primary Examiner* — Benjamin Sandvik
(74) *Attorney, Agent, or Firm* — Muncy, Geissler, Olds & Lowe, PLLC

(57) ABSTRACT

The application discloses a light-emitting diode chip level package structure including: a permanent substrate having a first surface and a second surface; a first electrode on the first surface; a second electrode on the second surface; an adhesive layer on where the first surface of the permanent substrate is not covered by the first electrode; a growth substrate on the adhesive layer; a patterned semiconductor structure on the growth substrate; a third electrode and a fourth electrode on the patterned semiconductor structure and electrically connect with the patterned semiconductor structure; an electrical connecting structure on the sidewall of the patterned semiconductor structure electrically connecting the third electrode and the fourth electrode with the first electrode; and an insulation layer located on the side wall of the patterned semiconductor structure and between the electrical connecting structure for electrically insulating the patterned semiconductor structure.

14 Claims, 19 Drawing Sheets

CHIP LEVEL PACKAGE OF LIGHT-EMITTING DIODE

CROSS REFERENCE TO RELATED APPLICATIONS

This application claims the right of priority based on Taiwan Patent Application No. 097151602 entitled "A Chip Level Package of Light-emitting Diode", filed Dec. 30, 2008, which is incorporated herein by reference and assigned to the assignee herein.

TECHNICAL FIELD

The present application generally relates to a light-emitting device, and more particularly to a light-emitting device with a chip level package.

BACKGROUND

The LED industry has developed vigorously, and the package sector has become the main battlefield. From the experience, how to develop a light, thin, short, small, low cost, and high efficiency package is an invariable design benchmark. Currently, a light-emitting apparatus must be formed with other devices. FIG. 11 is a diagram of a known light-emitting apparatus structure. As FIG. 11 shows, a light-emitting apparatus 600 includes at least a sub-mount 64 with a circuit and a solder 62 on the sub-mount 64. A light-emitting diode chip 400 includes at least one substrate 58 on the sub-mount 64, a semiconductor epitaxial stack layer 54 on the substrate 58, an electrode 56 on the semiconductor epitaxial stack layer 54, and an electrical connecting structure 66. The light-emitting diode chip 400 is adhered on the sub-mount 64, and the substrate 58 of the light-emitting diode chip 400 is electrically connected with the circuit of the sub-mount 64 by the solder 62. Furthermore, an electrical connecting structure 66 is electrically connected the electrode 56 of the light-emitting diode chip 400 with the circuit on the sub-mount 64. The sub-mount 64 can be a lead frame or a large scale mounting substrate convenient for the circuit design of the light-emitting apparatus 600 and the heat dissipation. The lead frame and the plastic cup by injection molding may have become the history. The wafer level package, chip level package, and 3-D package are now replacement. From the saving cost and light, thin, short, and small points of view, the chip level package is a practicable method.

SUMMARY

The present application provides a chip level package technology to reduce the size of the light-emitting device and simplify the manufacturing process. Furthermore, the light extraction efficiency of the light-emitting device is enhanced.

One embodiment of the present application provides a permanent substrate embedded with a passive device, and the passive device can connect electrically with the semiconductor epitaxial stack layer in series or parallel.

One embodiment of the present application provides a permanent substrate wherein the material of the permanent substrate can be an insulating material composited with a high thermally-conductive material. The material of the insulating material can be ceramic material, glass, or polymer material. The material of the high thermally-conductive material can be silver, cupper, graphite, silicon carbide, or gold. The high thermally-conductive material region includes a plurality of thermal conduction through-holes to dissipate the heat effectively.

One embodiment of the present application provides a light extraction microstructure on the semiconductor epitaxial stack layer wherein the shape of the light extraction microstructure can be column, Fresnel lens, or saw.

One embodiment of the present application provides a photonic crystal structure wherein the photonic crystal structure is formed by the nanoimprint technology. The photonic crystal structure assures the light emitted from the light-emitting diode not to emit randomly and to increase the chance for the light to emit upwards. The scatter angle of the light-emitting diode is therefore reduced and the efficiency is enhanced.

One embodiment of the present application provides an optical-electrical device operated by alternating current comprising a plurality of light-emitting devices connecting electrically in series.

BRIEF DESCRIPTION OF THE DRAWINGS

The foregoing aspects and many of the attendant advantages of present application will become more readily appreciated as the same becomes better understood by reference to the following detailed description, when taken in conjunction with the accompanying drawings, wherein.

DETAILED DESCRIPTION OF THE PREFERRED EMBODIMENTS

Figure 1A:
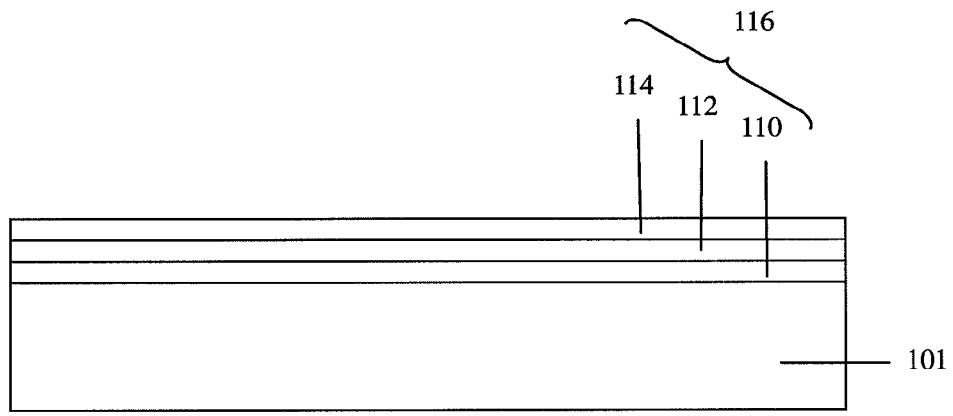
FIGS. 1A-1L illustrate a manufacturing process flow of forming a light-emitting diode device 100 in accordance with the first embodiment of the present application.
Figure 1B:
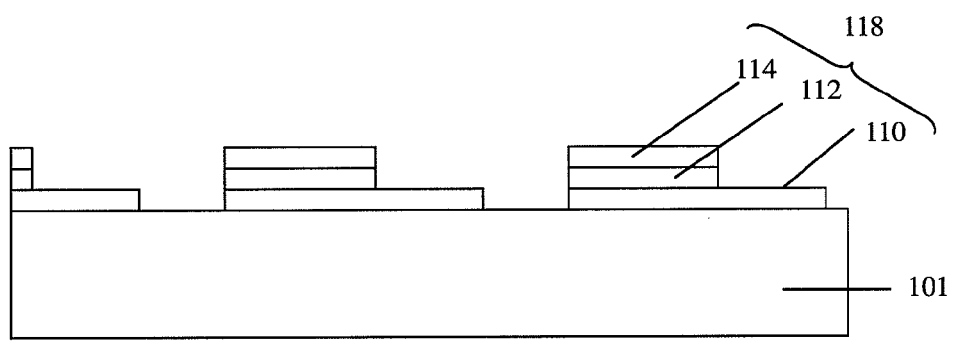
Figure 1C:
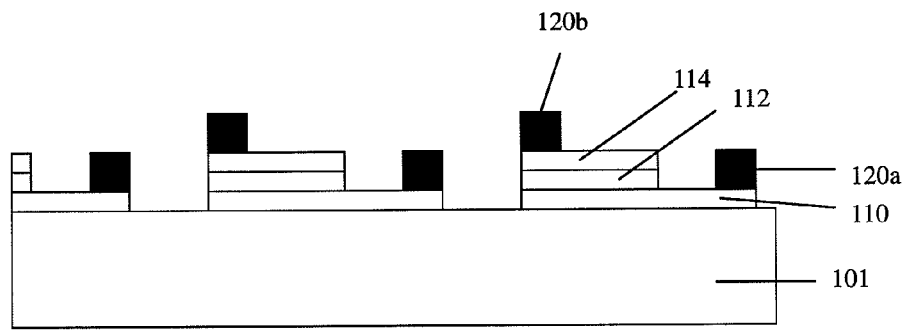
Figure 1D:
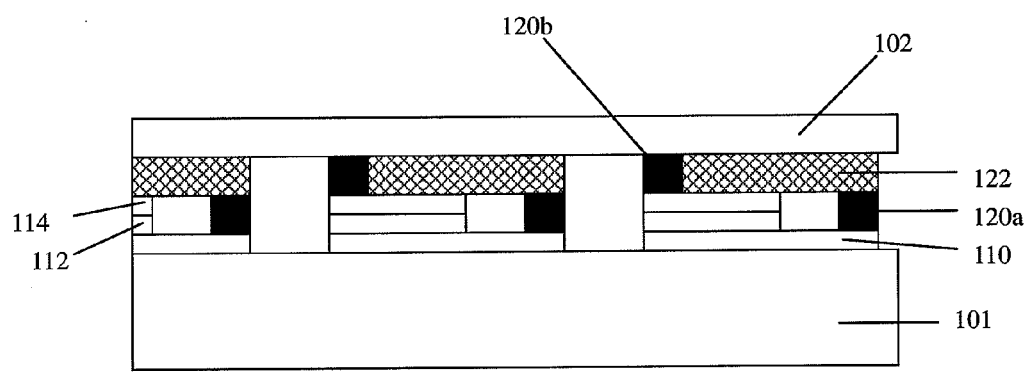
Figure 1E:
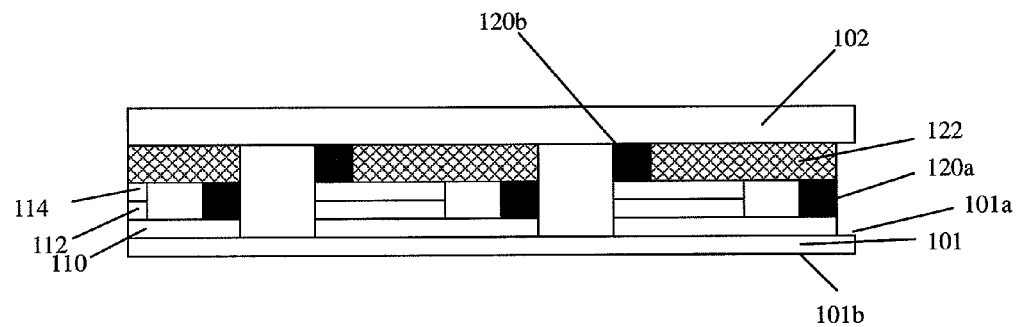
Figure 1F:
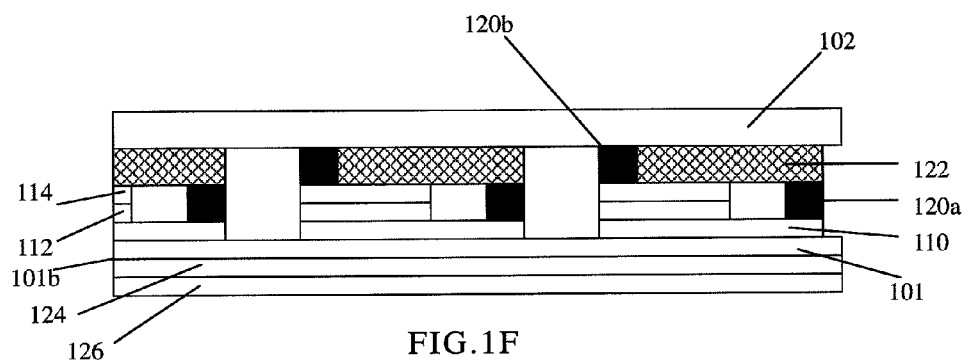
Figure 1G:
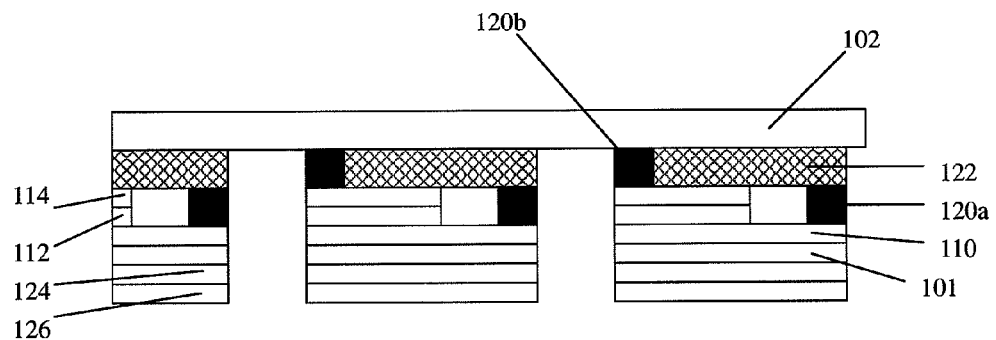
Figure 1H:
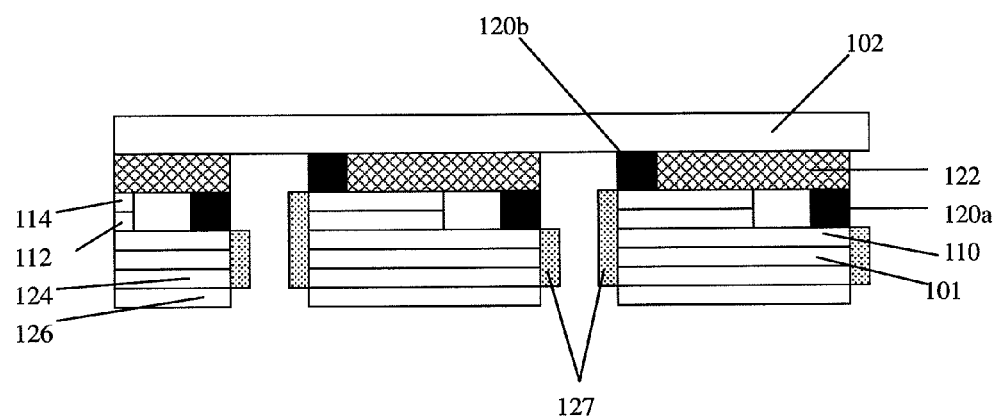

A manufacturing process flow of forming a light-emitting diode device 100 in accordance with the first embodiment of the present application is illustrated in FIG. 1A to FIG. 1L. Referring to FIG. 1A, a growth substrate 101 with a first surface 101*a* and a second surface 101*b* is provided, and the material of the growth substrate can be sapphire. An epitaxial structure 116 is formed on the first surface 101*a* of the growth substrate 101 by epitaxial process such as MOCVD, LPE, or MBE. The epitaxial structure 116 includes at least a first conductivity type semiconductor layer 110, such as n-type $(Al_xGa_{1-x})_yIn_{1-y}N$ layer; an active layer 112, such as a multiple quantum wells structure of $(Al_aGa_{1-a})_bIn_{1-b}N$; and a second conductivity type semiconductor layer 114, such as p-type $(Al_xGa_{1-x})_yIn_{1-y}N$ layer. Besides, the active layer 112 in this embodiment can be formed as a homostructure, single heterostructure, or double heterostructure. Referring to FIG. 1B, a patterned semiconductor structure 118 is formed by etching the epitaxial structure 116 on the growth substrate 101. Referring to FIG. 1 C, a third electrode 120*a* and a fourth electrode 120*b* are formed on the first conductivity type semiconductor layer 110 and the second conductivity type semiconductor layer 114 respectively. Referring to FIG. 1D, a connecting layer 122 is provided to connect a temporary substrate 102 with the patterned semiconductor structure 118. Referring to FIG. 1E, a portion of the growth substrate 101 is removed by polishing or etching so the remaining of the growth substrate has a thickness of about 10 μm. Referring to FIG. 1F, a reflective layer 124 and a metal adhesive layer 126 are formed in sequence on the second surface 101*b* of the growth substrate 101. Next, cutting the metal adhesive layer 126, the reflective layer 124, and the growth substrate 101 as FIG. 1G indicates. An insulation layer 127 is then formed on the sidewall of the patterned semiconductor structure 118, the growth substrate 101 and the reflective layer 124 as shown in FIG. 1H.

Figure 1I:
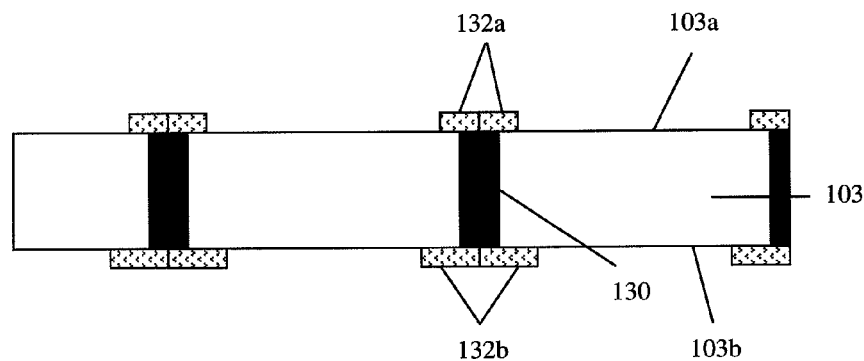
Figure 1J:
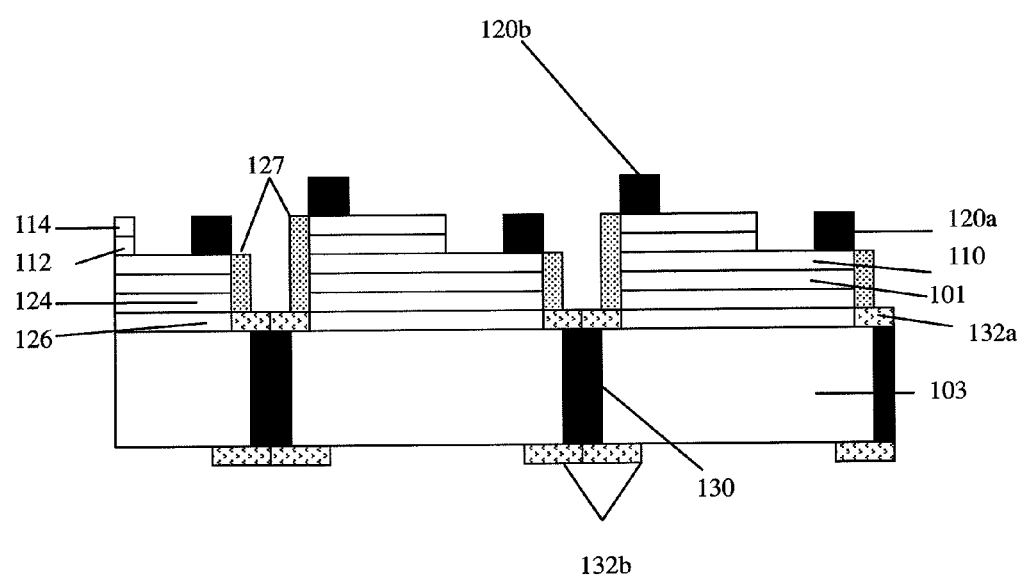
Figure 1K:
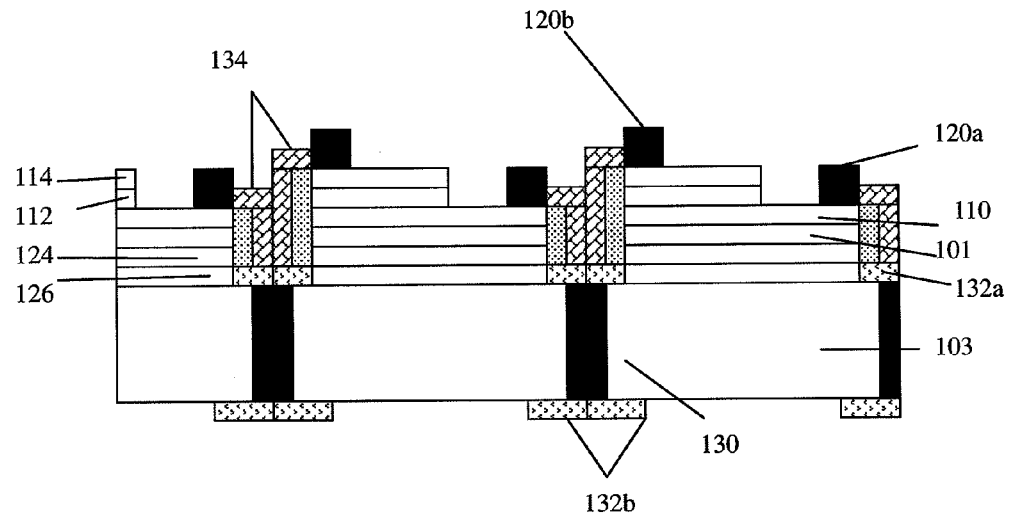
Figure 1L:
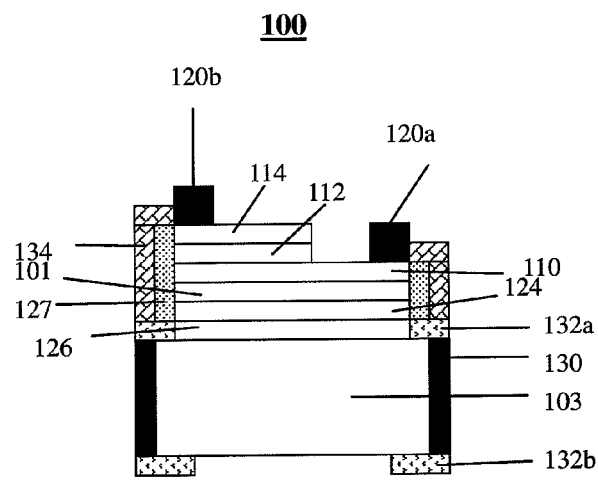

Referring to FIG. 1I, a permanent substrate 103 with a first surface 103*a* and a second surface 103*b* is provided, and the material of the permanent substrate can be ceramic material, glass, composite material, or polymer material. A plurality of through-holes is formed on the permanent substrate 103 and penetrated through the permanent substrate 103, and is filled with electrically conductive material 130. A first electrode 132*a* and a second electrode 132*b* are formed on the first surface 103*a* of the permanent substrate and the second surface 103*b* of that respectively. The structure shown in FIG. 1H is adhered with the permanent substrate shown in FIG. 1I by the metal adhesive layer 126, and the temporary substrate 102 and the connecting layer 122 are removed as FIG. 1J shows. An electrical connecting structure 134 is formed by electroplating or film deposition process to electrically connect the third electrode 120*a* and the fourth electrode 120*b* with the first electrode 132*a* of the permanent substrate as shown in FIG. 1K. A light-emitting diode device 100 shown in FIG. 1L is formed after dicing. The light-emitting diode device 100 electrically connects with the circuit board of the light-emitting by the second electrode 132*b* of the permanent substrate so there is no need of the sub-mount for heat dissipation.

Figure 2:
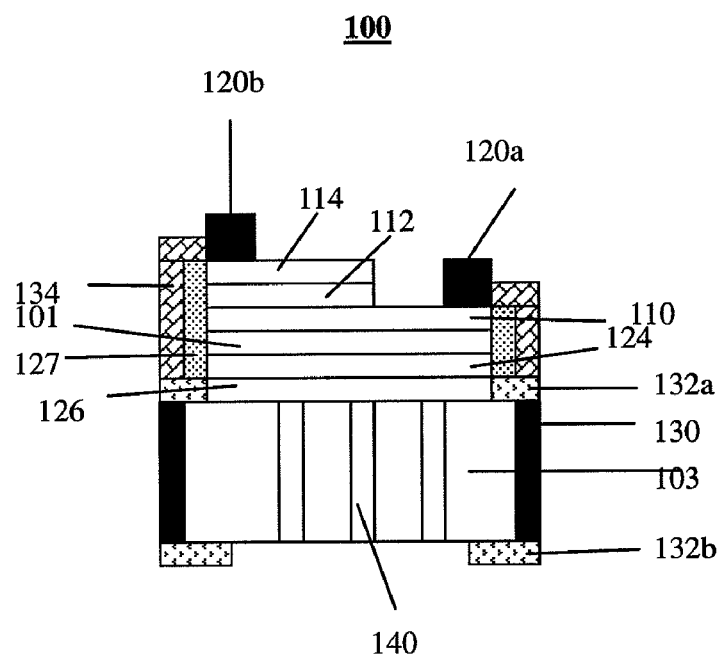
FIG. 2 illustrates one structure of the light-emitting diode device 100 in accordance with the first embodiment of the present application.

Referring to FIG. 2, the permanent substrate of the light-emitting diode device 100 can be composited with insulating material and high thermally-conductive material. The insulating material can be ceramic material, glass, or polymer material; the high thermally-conductive material can be silver, copper, graphic, silicon carbide, or gold. A plurality of thermal conduction through-holes 140 are included the high thermally-conductive material region for heat dissipation.

Figure 3:
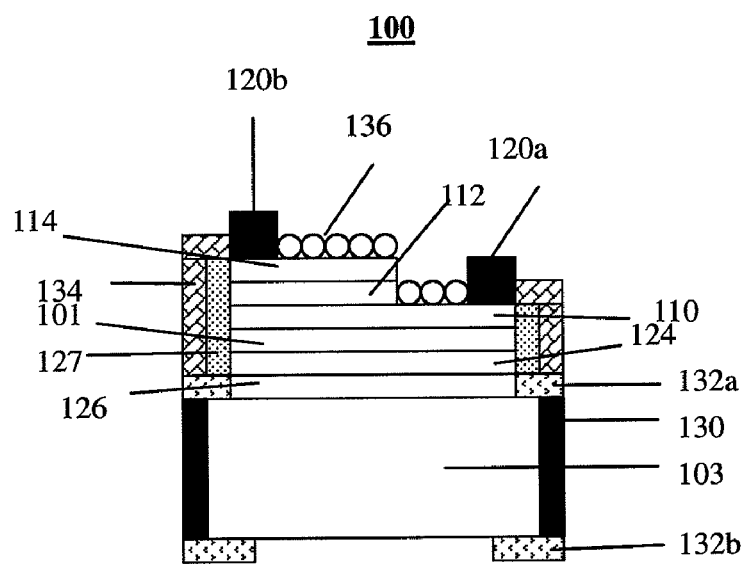
FIG. 3 illustrates another structure of the light-emitting diode device 100 in accordance with the first embodiment of the present application.
Figure 4:
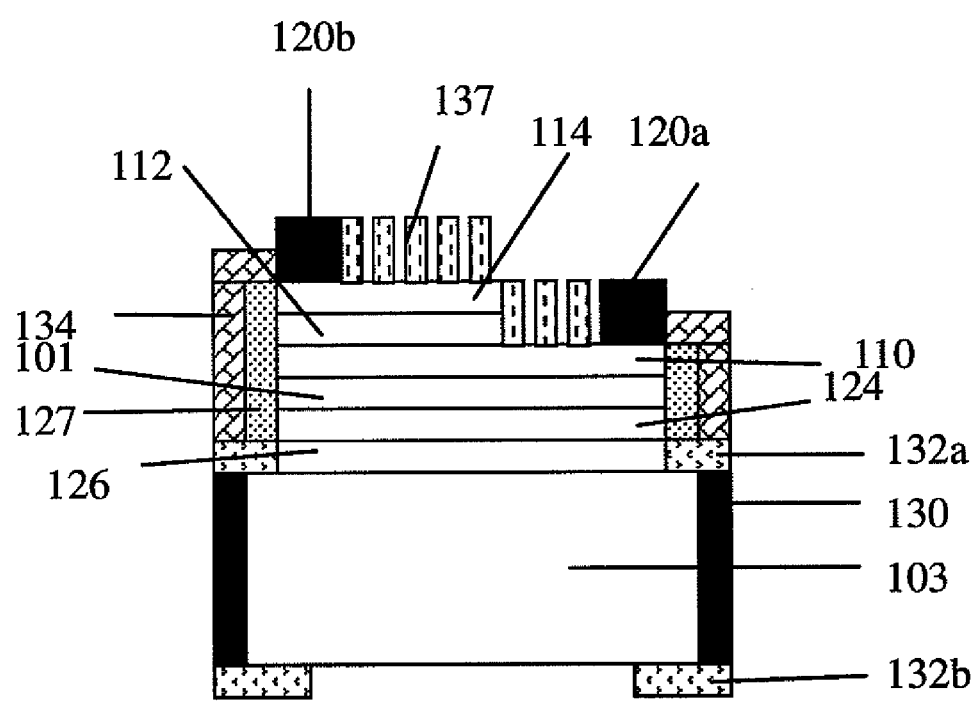
FIG. 4 illustrates further another structure of the light-emitting diode device 100 in accordance with the first embodiment of the present application.

Referring to FIG. 3, a light extraction microstructure 136 is formed on where the top surface of the first conductivity type semiconductor layer 110 is not covered by the electrode and on where the top surface of the second conductivity type semiconductor layer 114 is not covered by the electrode of the light-emitting diode device 100 respectively, and the shape of the light extraction microstructure can be column, Fresnel lens, and saw. The purpose of the light extraction microstructure is to increase the light extraction efficiency. Referring to FIG. 4, a photonic crystal structure 137 can also be formed on where the top surface of the first conductivity type semiconductor layer 110 is not covered by the electrode and on where the top surface of the second conductivity type semiconductor layer 114 is not covered by the electrode of the light-emitting diode device 100 respectively. The photonic crystal structure assures the light emitted from the light-emitting diode not to emit randomly and to increase the chance for the light to emit upwards. The scatter angle of the light-emitting diode is therefore reduced and the efficiency is enhanced.

Figure 5A:
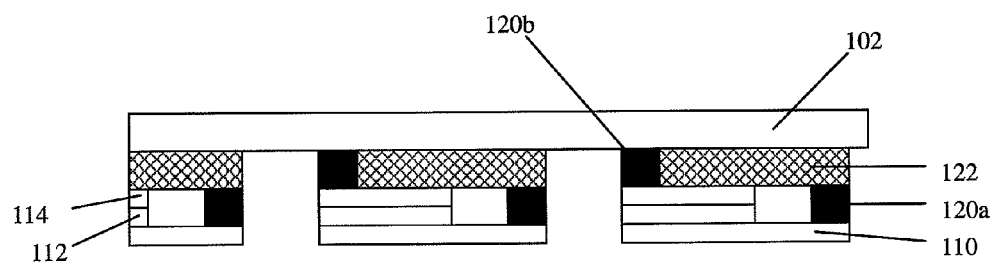
FIGS. 5A-5H illustrate a manufacturing process flow of forming a light-emitting diode device 200 in accordance with the second embodiment of the present application.
Figure 5B:
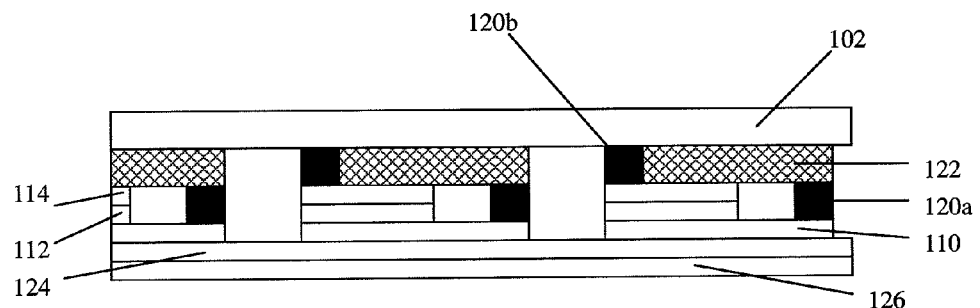
Figure 5C:
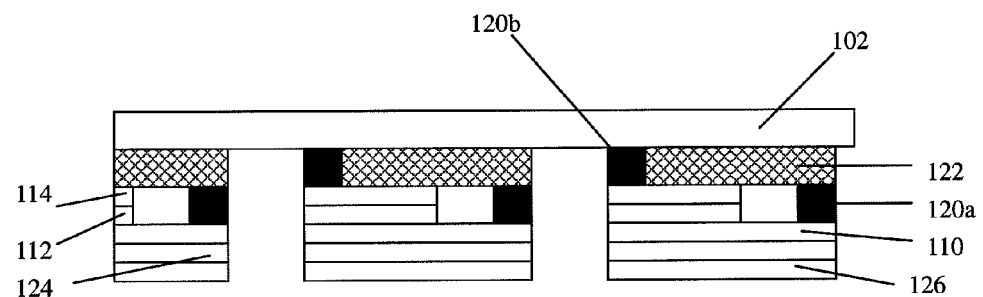
Figure 5D:
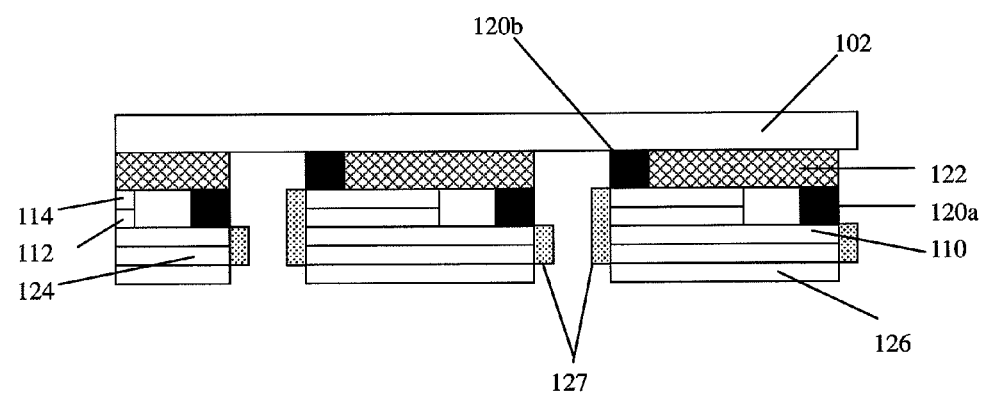

A former manufacturing process flow of forming a light-emitting diode device 200 in accordance with the second embodiment of the present application is the same as that of the first embodiment as shown in FIG. 1A to FIG. 1D. Referring to FIG. 5A, the growth substrate 101 is removed by the chemical selection etching or polishing method. Referring to FIG. 5B, a reflective layer 124 and a metal adhesive layer 126 are formed in sequence under the first conductivity type semiconductor layer 110. Next, cutting the metal adhesive layer 126 and the reflective layer 124 as FIG.5C indicates. An insulation layer 127 is then formed on the sidewall of the patterned semiconductor structure 118 and the insulating reflective layer 124 as shown in FIG.5D.

Figure 5E:
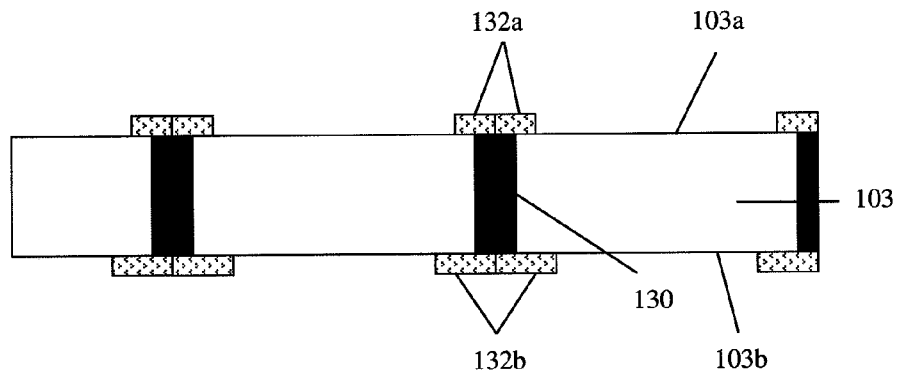
Figure 5F:
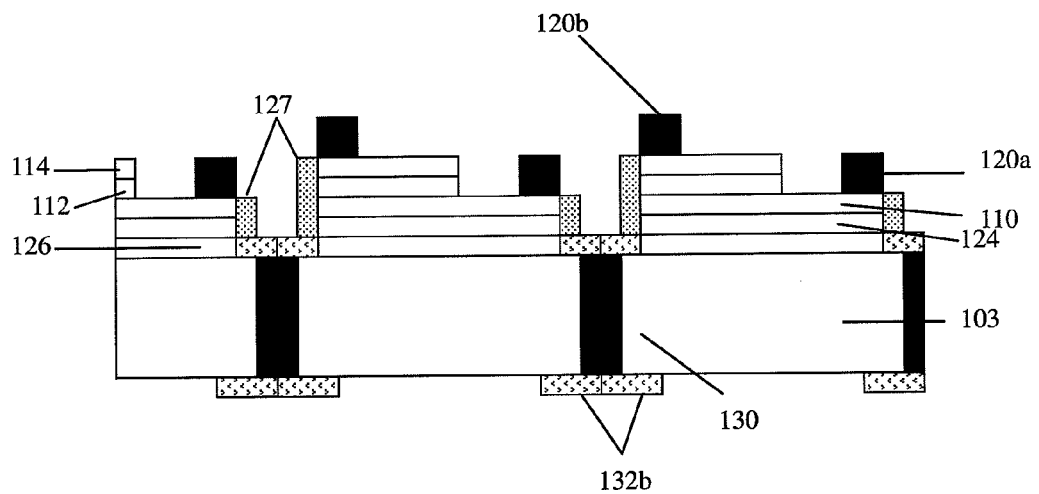
Figure 5G:
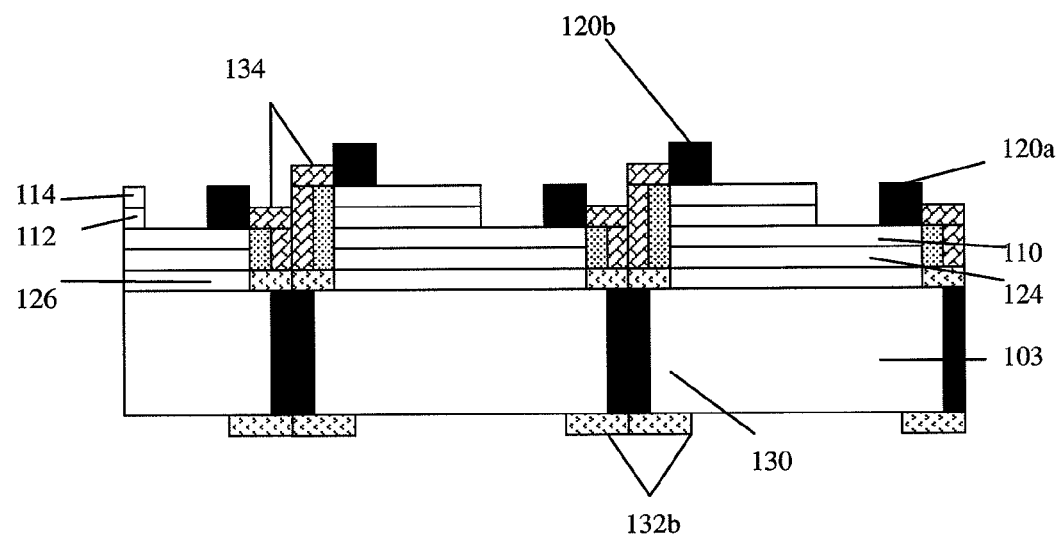
Figure 5H:
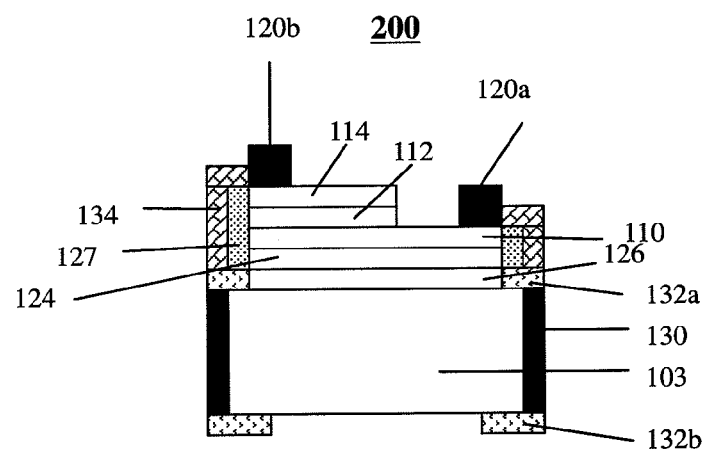

Referring to FIG. 5E, a permanent substrate 103 with a first surface 103*a* and a second surface 103*b* is provided, and the material of the permanent substrate can be ceramic material, glass, composite material, or polymer material. A plurality of holes is formed on the permanent substrate 103 and penetrated through the permanent substrate 103, and is filled with electrically conductive material 130. A first electrode 132*a* and a second electrode 132*b* are formed on the first surface 103*a* of the permanent substrate and on the second surface 103*b* of that respectively. The structure shown in FIG. 5D is adhered with the permanent substrate shown in FIG. 5E by the metal adhesive layer 126, and the temporary substrate 102 and the connecting layer 122 are removed as FIG. 5F shows. An electrical connecting structure 134 is formed by electroplating or film deposition process to electrically connect the third electrode 120*a* and the fourth electrode 120*b* with the first electrode 132*a* of the permanent substrate as shown in FIG. 5G. A light-emitting diode device 200 shown in FIG. 5H is formed after dicing. The light-emitting diode device 200 electrically connects with the circuit board of the light-emitting apparatus by the second electrode 132*b* of the permanent substrate so there is no need of the sub-mount for heat dissipation.

Figure 6:
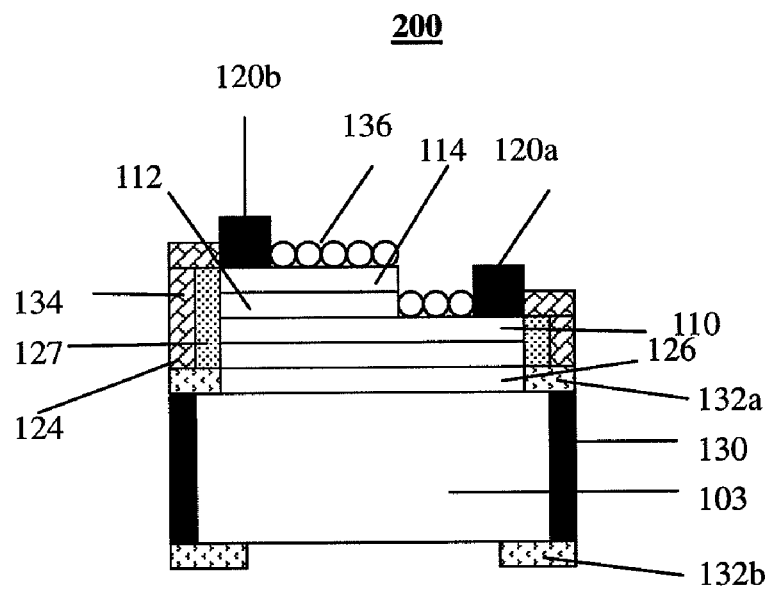
FIG. 6 illustrates one structure of the light-emitting diode device 200 in accordance with the second embodiment of the present application.
Figure 7:
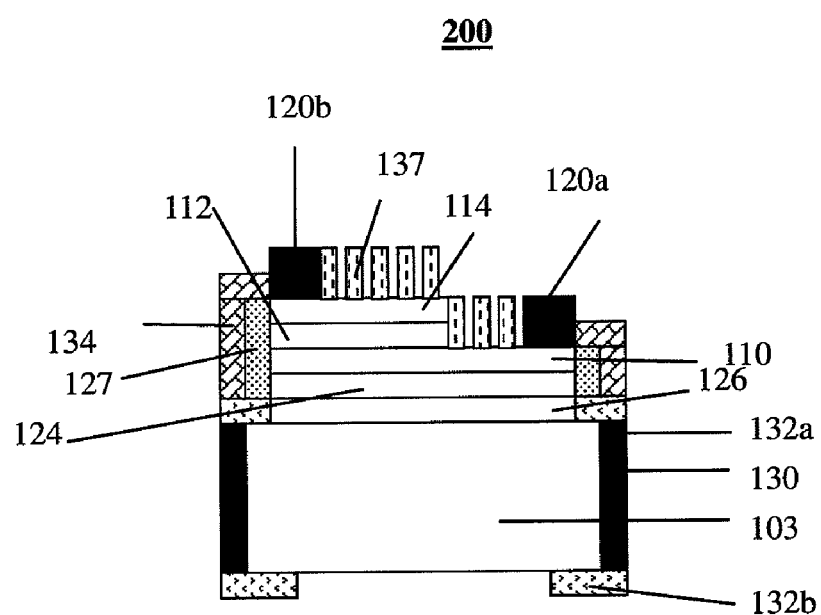
FIG. 7 illustrates another structure of the light-emitting diode device 200 in accordance with the second embodiment of the present application.

Referring to FIG. 6, a light extraction microstructure 136 is formed on where the top surface of the first conductivity type semiconductor layer 110 is not covered by the electrode and on where the top surface of the second conductivity type semiconductor layer 114 is not covered by the electrode of the light-emitting diode device 200 respectively, and the shape of the light extraction microstructure can be column, Fresnel lens, and saw. The purpose of the light extraction microstructure is to increase the light extraction efficiency. Referring to FIG. 7, a photonic crystal structure 137 can also be formed on where the top surface of the first conductivity type semiconductor layer 110 is not covered by the electrode and on where the top surface of the second conductivity type semiconductor layer 114 is not covered by the electrode of the light-emitting diode device 200 respectively. The photonic crystal structure assures the light emitted from the light-emitting diode not to emit randomly and to increase the chance for the light to emit upwards. The scatter angle of the light-emitting diode is therefore reduced and the efficiency is enhanced.

Figure 8A:
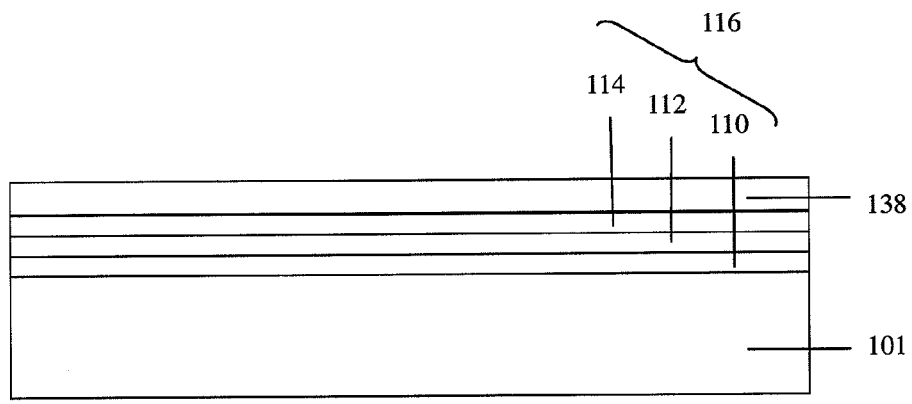
FIGS. 8A-8G illustrate a manufacturing process flow of forming a light-emitting diode device 300 in accordance with the third embodiment of the present application.

A manufacturing process flow of forming a light-emitting diode device 300 in accordance with the third embodiment of the present application is illustrated in FIG. 8A to FIG. 8G. Referring to FIG. 8A, a growth substrate 101 with a first surface 101a and a second surface 101b is provided, and the material of the growth substrate can be GaAs. An epitaxial structure 116 is formed on the first surface 101a of the growth substrate 101 by epitaxial process such as MOCVD, LPE, or MBE. The epitaxial structure 116 includes at least a first conductivity type semiconductor layer 110, such as n-type $(Al_xGa_{1-x})_yIn_{1-y}P$ layer; an active layer 112, such as a multiple quantum wells structure of $(Al_aGa_{1-a})_bIn_{1-b}P$; and a second conductivity type semiconductor layer 114, such as p-type $(Al_xGa_{1-x})_yIn_{1-y}P$ layer. Besides, the active layer 112 in this embodiment can be formed as a homostructure, single hetero structure, or double heterostructure. Next, a transparent adhesive layer 138 is formed on the epitaxial structure 116.

Figure 8B:
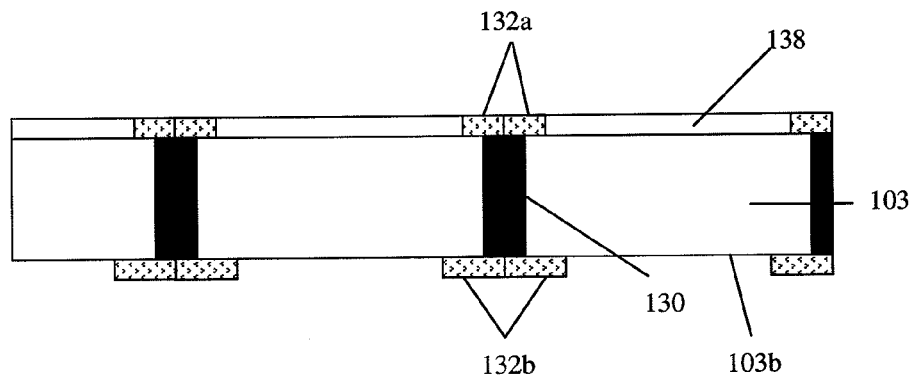
Figure 8C:
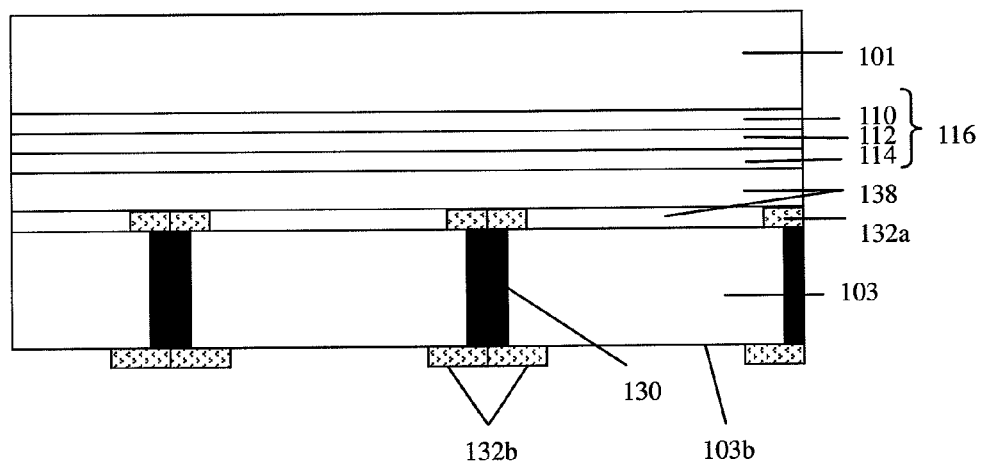
Figure 8D:
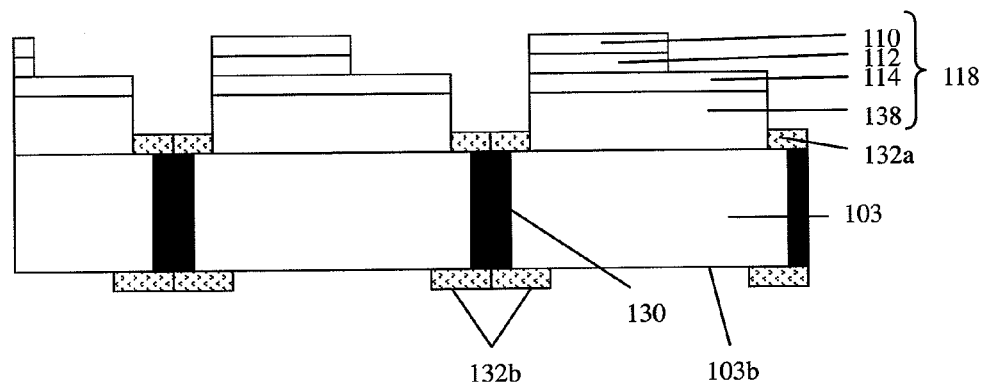
Figure 8E:
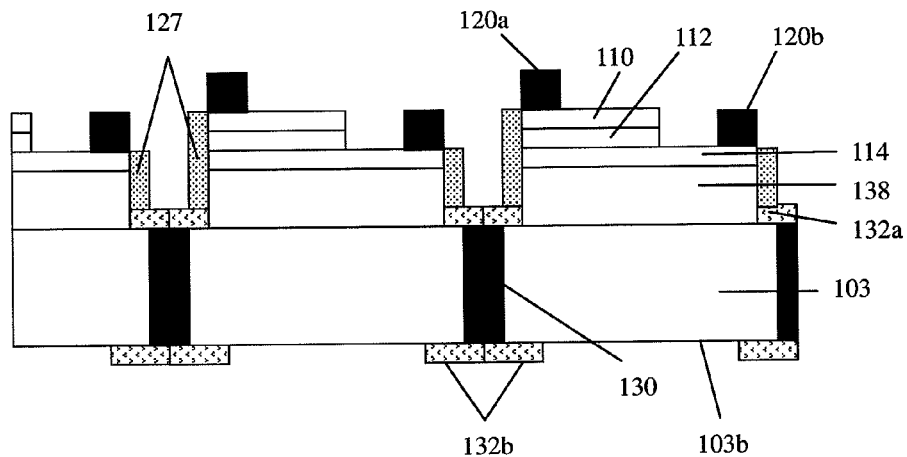
Figure 8F:
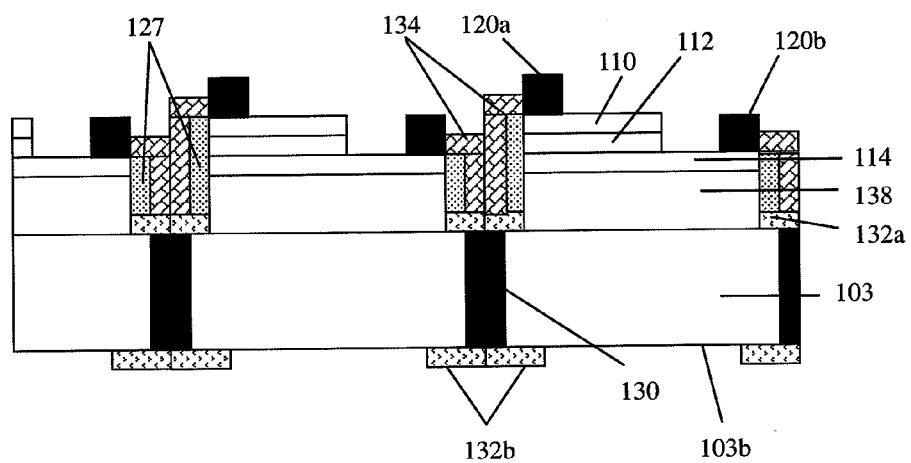
Figure 8G:
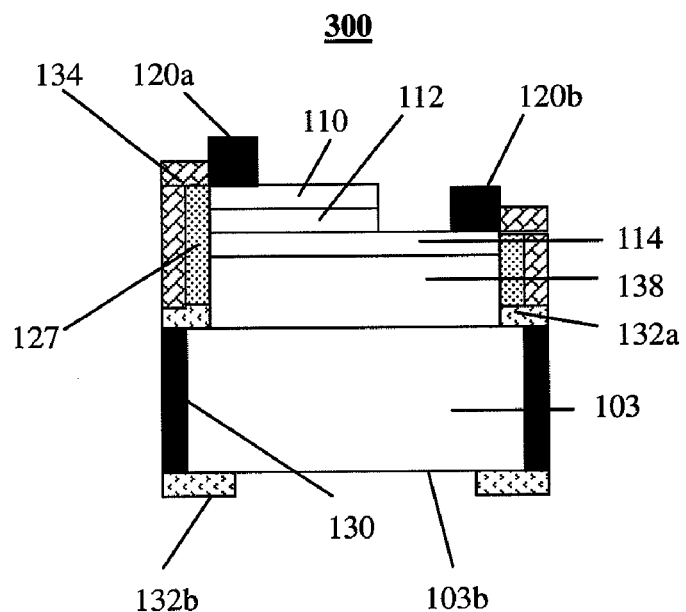

Referring to FIG. 8B, a permanent substrate 103 with a first surface 103a and a second surface 103b is provided, and the material of the permanent substrate can be ceramic material, glass, composite material, or polymer material. A plurality of through-holes is formed on the permanent substrate 103 and penetrated through the permanent substrate, and is filled with the electrically conductive material 130. A first electrode 132a and a second electrode 132b are formed on the first surface 103a of the permanent substrate and the second surface 103b of that respectively. Then, a transparent adhesive layer 138 is formed on where the first surface 103a of the permanent substrate is not covered by the first electrode 132a. The structure shown in FIG. 8A is adhered with the permanent substrate shown in FIG. 8B by the transparent adhesive layer 138 as FIG. 8C shows. Referring to FIG. 8D, the growth substrate 101 is removed by chemical selection etching or polishing method. A patterned semiconductor structure 118 is formed by etching the epitaxial structure 116 and the transparent adhesive layer 138. Referring to FIG. 8E, a third electrode 120a and a fourth electrode 120b are formed on the first conductivity type semiconductor layer 110 and the second conductivity type semiconductor layer 114 respectively. Next, an insulation layer 127 is formed on the sidewall of the patterned semiconductor structure 118. An electrical connecting structure 134 is formed by electro-plating or film deposition process to electrically connect the third electrode 120a and the fourth electrode 120b with the first electrode 132a of the permanent substrate as shown in FIG. 8F. A light-emitting diode device 300 shown in FIG. 8G is formed after dicing. The light-emitting diode device 300 electrically connects with the circuit board of the light-emitting apparatus by the second electrode 132b of the permanent substrate so there is no need of the sub-mount for heat dissipation.

Figure 9:
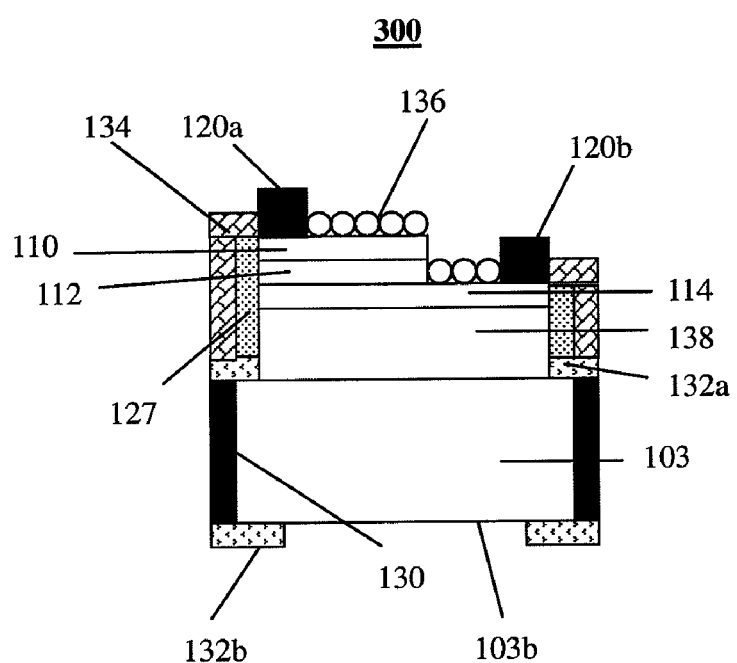
FIG. 9 illustrates one structure of the light-emitting diode device 300 in accordance with the third embodiment of the present application.
Figure 10:
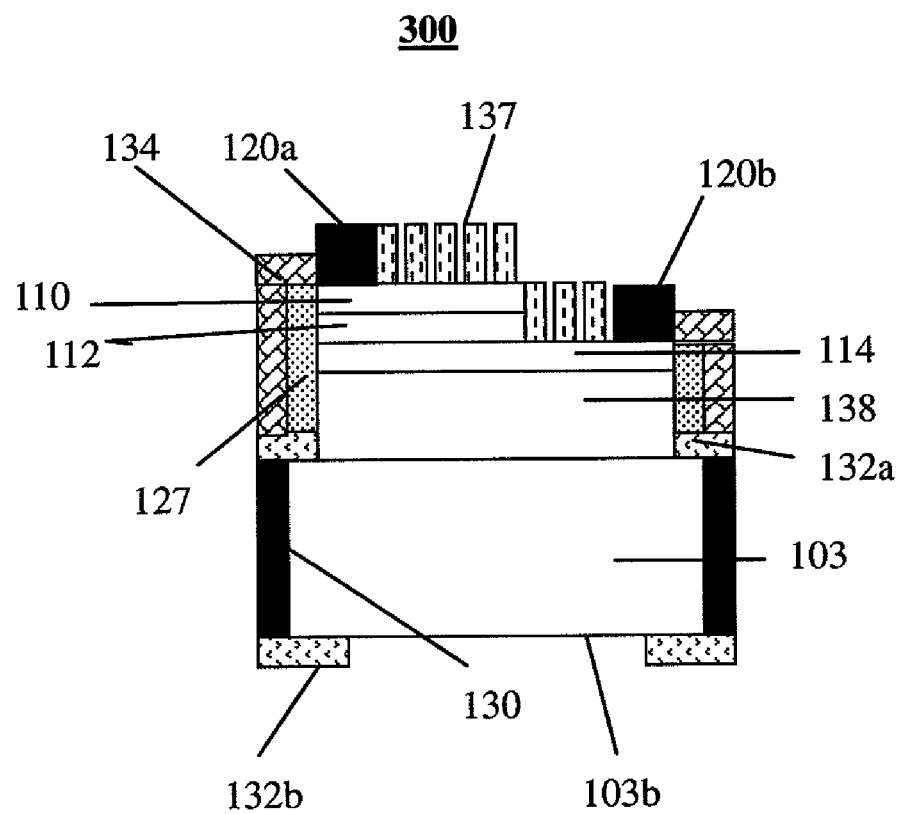
FIG. 10 illustrates another structure of the light-emitting diode device 300 in accordance with the third embodiment of the present application.
Figure 11:
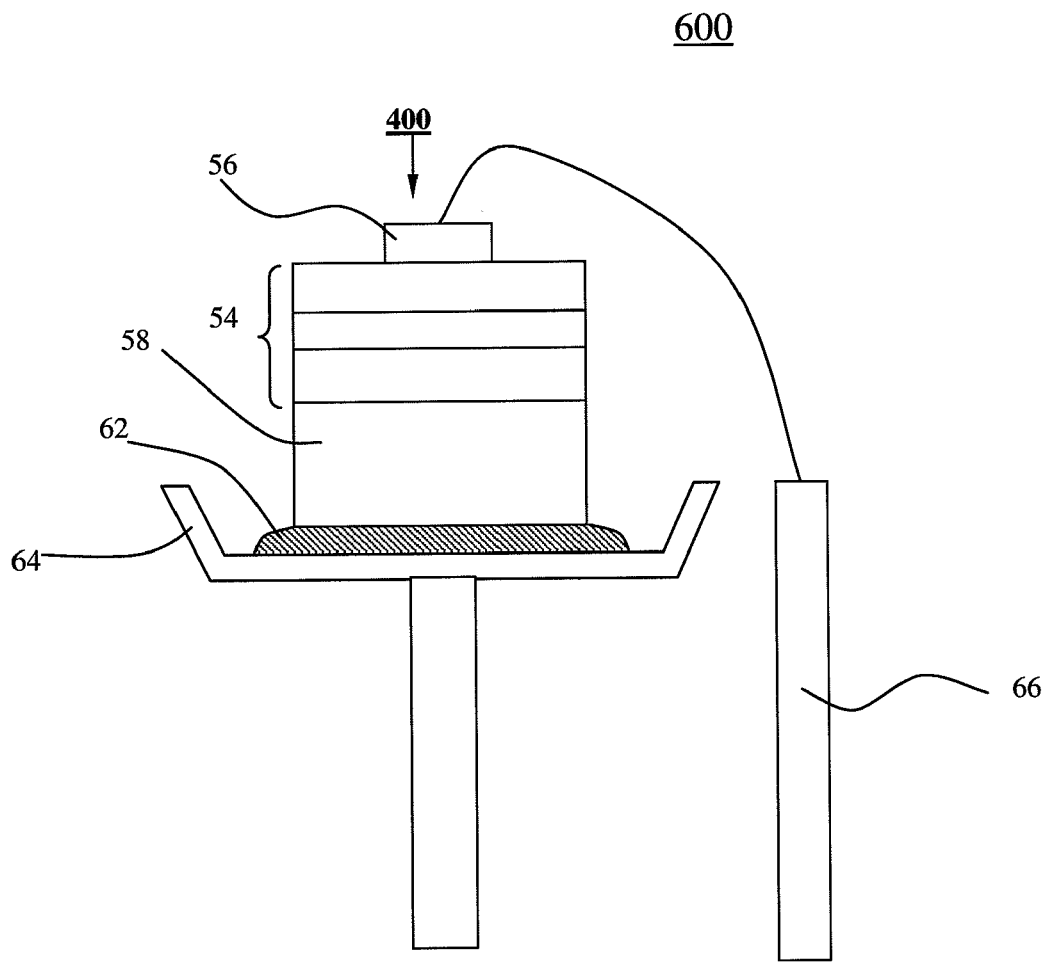
FIG. 11 illustrates a known light-emitting apparatus structure.

Referring to FIG. 9, a light extraction microstructure 136 is formed on where the top surface of the first conductivity type semiconductor layer 110 is not covered by the electrode and on where the top surface of the second conductivity type semiconductor layer 114 is not covered by the electrode of the light-emitting diode device 300 respectively, and the shape of the light extraction microstructure can be column, Fresnel lens, and saw. The purpose of the light extraction microstructure is to increase the light extraction efficiency. Referring to FIG. 10, a photonic crystal structure 137 can also be formed on where the top surface of the first conductivity type semiconductor layer 110 is not covered by the electrode and on where the top surface of the second conductivity type semiconductor layer 114 is not covered by the electrode of the light-emitting diode device 300 respectively. The photonic crystal structure assures the light emitted from the light-emitting diode not to emit randomly and to increase the chance for the light to emit upwards. The scatter angle of the light-emitting diode is therefore reduced and the efficiency is enhanced.

The multiple electrodes in series connection in the chip layout design is also adopted to achieve the requirement of the operation under alternating current, and the permanent substrate can be embedded with passive devices such as resistors or capacitors to save the space.

Other embodiments of the application will be apparent to those having ordinary skills in the art from consideration of the specification and practice of the invention disclosed herein. It is intended that the specification and examples be considered as exemplary only, with a true scope and spirit of the invention being indicated by the following claims.

We claim:

1. A light-emitting diode device, comprising:
    a permanent substrate having a first surface and a second surface;
    a first electrode on the first surface of the permanent substrate;
    an adhesive layer on where the first surface of the permanent substrate is not covered by the first electrode;
    a growth substrate on the adhesive layer;
    a patterned semiconductor structure on the growth substrate comprising:
        a first conductivity type semiconductor layer; and
        a second conductivity type semiconductor layer on the first conductivity type semiconductor layer wherein the second conductivity type is different from the first conductivity type;
    a third electrode and a fourth electrode on the patterned semiconductor structure, which electrically connected with the first conductivity type semiconductor layer and the second conductivity type semiconductor layer respectively;
    an electrical connecting structure on the sidewall of the patterned semiconductor structure, wherein the third electrode and the fourth electrode electrically connected with the first electrode by the electrical connecting structure;
    an insulation layer located on the sidewall of the patterned semiconductor structure and between the electrical connecting structure to insulate electrically the patterned semiconductor structure and the electrical connecting structure; and
    a reflective layer between the growth substrate and the permanent substrate.

2. The light-emitting diode device according to claim 1, wherein the growth substrate is a polished thinner substrate.

3. The light-emitting diode device according to claim 1, wherein the permanent substrate further including a plurality of through-holes for thermal conduction.

4. The light-emitting diode device according to claim 1, wherein the permanent substrate can be embedded with a passive device, wherein the passive device electrically connected with patterned semiconductor structure in series or parallel.

5. The light-emitting diode device according to claim 1, wherein the material of the permanent substrate can be ceramic material, glass, composite material, or polymer material.

6. The light-emitting diode device according to claim 1, wherein the material of the patterned semiconductor structure comprising at least one or more elements selected from the group consisting of gallium, aluminum, indium, arsenic, phosphorous, and nitrogen.

7. The light-emitting diode device according to claim 1, further including a light extraction microstructure on the patterned semiconductor structure.

8. The light-emitting diode device according to claim 7, wherein the shape of the light extraction microstructure is column, Fresnel lens, or saw.

9. The light-emitting diode device according to claim 1, further including a photonic crystal structure on the patterned semiconductor structure.

10. The light-emitting diode device according to claim 1, wherein the insulation layer is silicon nitride or silicon oxide.

11. The light-emitting diode device according to claim 1, further including a second electrode on the second surface of the permanent substrate.

12. The light-emitting diode device according to claim 11, wherein the permanent substrate further including a plurality of though-holes is filed with electrically conductive material to connect the first electrode and the second electrode.

13. A light-emitting apparatus operating by alternating current, comprising:
   a circuit board; and
   a plurality of light-emitting diodes on the circuit board, wherein the light-emitting diodes structure is formed according to claim 1.

14. The light-emitting apparatus according to claim 13, wherein the light emitting diodes electrically connected in series.

* * * * *